United States Patent
Kobayashi (10) Patent No.: US 9,498,950 B2
(45) Date of Patent: Nov. 22, 2016

(54) RETAINING STRUCTURE OF WIRING MEMBER, LIQUID DISCHARGE HEAD, LIQUID DISCHARGE DEVICE, AND LIQUID DISCHARGE APPARATUS

(71) Applicant: Hirofumi Kobayashi, Kanagawa (JP)

(72) Inventor: Hirofumi Kobayashi, Kanagawa (JP)

(73) Assignee: RICOH COMPANY, LTD., Tokyo (JP)

( * ) Notice: Subject to any disclaimer, the term of this patent is extended or adjusted under 35 U.S.C. 154(b) by 0 days.

(21) Appl. No.: 14/931,042

(22) Filed: Nov. 3, 2015

(65) Prior Publication Data

US 2016/0128175 A1    May 5, 2016

(30) Foreign Application Priority Data

Nov. 4, 2014 (JP) ................................ 2014-224746
Aug. 8, 2015 (JP) ................................ 2015-157832

(51) Int. Cl.
     *B41J 2/14*      (2006.01)

(52) U.S. Cl.
     CPC ......... *B41J 2/14072* (2013.01); *B41J 2/14233* (2013.01); *B41J 2002/14241* (2013.01); *B41J 2002/14403* (2013.01); *B41J 2002/14491* (2013.01); *B41J 2202/18* (2013.01)

(58) Field of Classification Search
     CPC .................. B41J 2/14072; B41J 2002/14491; B41J 2202/18
     See application file for complete search history.

(56) References Cited

U.S. PATENT DOCUMENTS

| | | | |
|---|---|---|---|
| 2003/0043235 A1* | 3/2003 | Sakurai | B41J 2/04511 347/57 |
| 2010/0271431 A1* | 10/2010 | Kawamura | B41J 2/14072 347/50 |
| 2010/0329707 A1 | 12/2010 | Yamada | |
| 2014/0029988 A1 | 1/2014 | Shimizu et al. | |

FOREIGN PATENT DOCUMENTS

| | | |
|---|---|---|
| JP | 9-106192 | 4/1997 |
| JP | 2001-135675 | 5/2001 |
| JP | 2007-335477 | 12/2007 |
| JP | 2009-255444 | 11/2009 |
| JP | 2013-230591 | 11/2013 |

OTHER PUBLICATIONS

Mar. 7, 2016 European search report in connection with corresponding European patent Application No. 15188673.6.

* cited by examiner

*Primary Examiner* — Geoffrey Mruk
(74) *Attorney, Agent, or Firm* — Cooper & Dunham LLP (57) ABSTRACT

A retaining structure of a flexible wiring member includes a flexible wiring member and a retaining member. The flexible wiring member includes a front side wiring electrode formed on a front side of the flexible wiring member and a rear side electrode formed on a rear side thereof, and the flexible wiring member is bonded to the retaining member via the rear side electrode. Such structure may be employed in a liquid discharge head in which wiring and a pressure generator are disposed in an actuator substrate including an electrode. The electrode of the actuator and that of the flexible wiring member are connected, and the flexible wiring member is retained to the actuator or a member joined to the actuator via the retaining structure of the wiring member.

14 Claims, 9 Drawing Sheets

RETAINING STRUCTURE OF WIRING MEMBER, LIQUID DISCHARGE HEAD, LIQUID DISCHARGE DEVICE, AND LIQUID DISCHARGE APPARATUS

CROSS-REFERENCE TO RELATED APPLICATIONS

The present application claims priority pursuant to 35 U.S.C. §119(a) from Japanese patent application numbers 2014-224746 and 2015-157832, filed on Nov. 4, 2014, and Aug. 8, 2015, respectively, the entire disclosure of each of which is incorporated by reference herein.

BACKGROUND

Technical Field

The present invention relates to a retaining structure of a wiring member, a liquid discharge head, a liquid discharge device, and a liquid discharge apparatus.

Background Art

As a retaining structure of a flexible wiring member, a liquid discharge head includes a flexible printed circuit board (FPC) (hereinafter, simply "FPC") that is adhered to an electrical wiring board with an adhesive, to thereby connect a wiring electrode of the FPC and electrical wiring of the electrical wiring board via wire bonding.

Alternatively, a similar liquid discharge head includes an FPC adhered to a reinforcing plate connecting to a nozzle substrate, and the FPC is connected to a piezoelectric element via wire bonding.

A substrate of the flexible wiring member such as the FPC is generally formed of polyimide resin exhibiting weaker adhesion. As a result, it is difficult to obtain sufficient bonding strength with a small bonding area when the wiring member is bonded/secured to another member with an adhesive.

SUMMARY

In one embodiment of the disclosure, provided is an optimal retaining structure of a flexible wiring member including a flexible wiring member; and a retaining member. The flexible wiring member includes a front side wiring electrode formed on a front side the flexible wiring member and a rear side wiring electrode formed on a rear side of the flexible wiring member, and the flexible wiring member is bonded to the retaining member via the rear side wiring electrode.

In another embodiment of the disclosure, provided is a liquid discharge head including a plurality of nozzles to discharge a liquid; an individual liquid chamber to hold the liquid; a pressure generator to press the liquid inside the individual liquid chamber; an actuator substrate, including an electrode, in which a wiring and the pressure generator are disposed. The electrode of the actuator and that of the flexible wiring member are connected; and the flexible wiring member is retained to the actuator or a member joined to the actuator via the above-describe In further another embodiment of the disclosure, provided are liquid discharge device including the liquid discharge head and a liquid discharge apparatus including the liquid discharge device and/or the liquid discharge head.

These and other objects, features, and advantages of the present invention will become apparent upon consideration of the following description of the preferred embodiments of the present invention when taken in conjunction with the accompanying drawings.

DETAILED DESCRIPTION

Hereinafter, preferred embodiments of the present invention will be described referring to accompanying drawings.

It is to be noted that the term "image formation" means not only recording, but also printing, image printing, molding, and the like.

Figure 1:
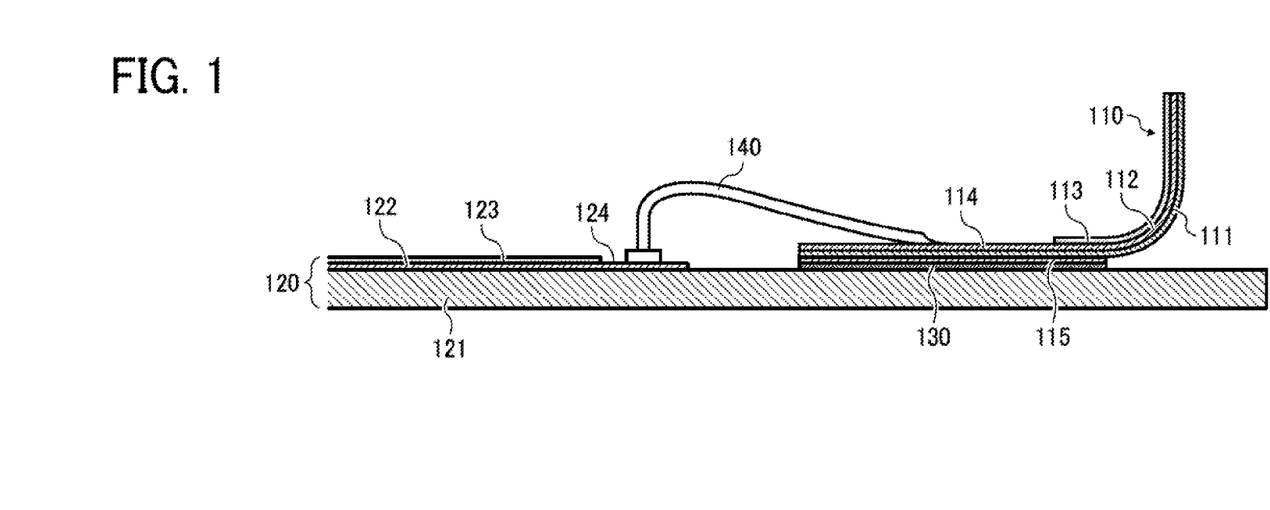
FIG. 1 is a cross-sectional view of a retaining structure of a wiring member according to a first embodiment of the present invention.

FIG. 1 is a cross-sectional view of a retaining structure of a wiring member (or a retaining structure of a flexible wiring member) according to a first embodiment of the present invention. An FPC 110, a flexible wiring member, is adhered and secured to a substrate 120 serving as a retaining member, with an adhesive 130. The FPC 110 includes a substrate 111, a wiring electrode 112 as an electrode for wiring, a coating 113, and an electrode 115 disposed on a side opposite the wiring electrode 112.

Herein, the substrate 111 is formed of a resin film with electrical insulation property, such as polyimide. The wiring electrode 112 is formed of highly conductive metals such as copper (CU) or copper alloys. The coating 113 is formed of resins with insulation property such as polyimide, and is formed by adhering a film-shaped resin, and by coating the liquid resin and curing it.

A terminal electrode 114 is disposed on an end of the wiring electrode 112. The terminal electrode 114 is connected to, for example, a wire 140 that is connected to the substrate 120. The terminal electrode 114 is formed of nickel (Ni) and gold (Au) by electro-plating or the like, with the gold coated on the surface layer.

The FPC 110 includes a rear side electrode 115 on a rear of the front side on which the wiring electrode 112 including the terminal electrode 114 is formed. The rear side electrode 115 is formed on an area corresponding to a rear side of the terminal electrode 114. The rear side electrode 115 is a dummy electrode that is not used for transmitting signals.

The rear side electrode 115 is, similarly to the wiring electrode 112, formed of a film of metals such as copper (CU) or copper alloys having optimal adhesion. If corrosion of copper may cause a problem, nickel can be applied on the surface layer.

In this case, differently from the surface of the terminal electrode 114, no gold (which is difficult to adhere) is coated on the surface of the rear side electrode 115. Specifically, the surface electrode of the terminal electrode 114 that forms the wiring electrode is different from that of the rear side electrode 115 as to the type of metal used. Due to this structure, reduction of adhesion can be minimized.

By contrast, the substrate 120, which is a retaining member, includes a base substrate 121, a wiring electrode 122, and a coating 123. Herein, the base substrate 121 is formed of an insulating substrate such as a glass epoxy resin, ceramic, silicon (Si), or the like. The wiring electrode 122 is formed of highly conductive metals such as gold, aluminum (Al), copper (CU), or an alloy of those metals.

When the coating 123 includes the base substrate 121 formed of the glass epoxy resin or the ceramic, a film-formed insulating resin such as epoxy or polyimide is adhered, or alternatively, a liquid resins is coated on the base substrate 121 and is cured. In addition, when the base substrate 121 is formed of silicon, SiN that is an insulating film commonly used in semiconductor process is employed.

A terminal electrode 124 is disposed on an end of the wiring electrode 122. The terminal electrode 124 is connected to the terminal electrode 114 of the FPC 110 via the wire 140. If the wiring electrode 122 employs such a metal that does not adhere well to the wire 140, it is preferred that the terminal electrode 124 be formed of nickel and gold by coating and the like, and the gold be plated on the surface layer.

An adhesive 130 is an agent that can adhere the rear side electrode 115 of the FPC 110 to the base substrate 121 of the substrate 120, and is not softened at a wire bonding temperature. In addition, preferably, an adhesive that can be cured at a low temperature in a short time of period is used for the adhesive 130. Further, considering the adhesion, heat resistance, humidity resistance, workability, and durability, a thermocurable adhesive is preferable. For example, preferable is an epoxy adhesive including a bisphenol A-type epoxy resin, bisphenol F-type epoxy resin, multi-functional epoxy resin, and the like, set as a main agent. In addition, an instant adhesive such as cyanoacrylate can also be used.

The wire 140 employs gold as a material. Other than the gold, the wire 140 may employ silver (Ag) or copper (Cu). Gold is preferably used for the wire bonding material to the FPC 110 due to ultrasonic vibration absorption in polyimide.

The FPC 110 is secured on the substrate 120 with the adhesive 130 via the rear side electrode 115, with the terminal electrode 114 disposed on an upper side.

For example, the adhesive 130 is supplied to an adhesion area between the base substrate 121 and the FPC 110 via dispenser, printing, sheet, and the like. Then, the FPC 110 is overlaid, and with the terminal electrode 114 left heated or at normal temperature while being pressed by a pressure member, and the adhesive 130 is cured, so that the FPC 110 can be adhered/bonded to the substrate 120.

Via wire bonding using ultrasonic wave, the wire 140 is connected to the terminal electrode 114 of the FPC 110 and to the terminal electrode 124 of the substrate 120.

Thus, the rear side electrode 115 formed of not softened metal at wire bonding temperature is adhered/bonded with the retaining member, that is, the substrate 120.

The FPC 110 includes the substrate 111 that is formed of polyimide resin with low adhesion, and is difficult to be secured to the substrate 120; however, the above process makes the bonding easier, a sufficient bonding strength and quality can be obtained with a small bonding area, and the cost of the adhesive can be reduced.

Further, the bonding quality of wire bonding is not degraded. Namely, because the vibration due to the ultrasonic wave is not absorbed in the adhesive layer in the wire bonding using the ultrasonic wave, the wire bonding can be done with a high bonding quality.

In addition, because the adhesive 130 having adhesive property at a low temperature in a short time of period is used, even though the substrate 120 that is heat-sensitive is used, no problem would occur.

In addition, the surface of the rear side electrode 115 of the FPC 110 is formed of copper or nickel, so that the bonding is made easier than using polyimide resins, the bonding strength and quality can be improved, and the cost of the adhesive can be reduced. In addition, an increase of cost by providing the rear side electrode 115 can be minimized.

Further, the size of the bonding area between the FPC 110 and the substrate 120 can be reduced, thereby enabling to make the FPC 110 and the substrate 120 to be made more compact and reducing the cost.

In the present embodiment, the surface of the terminal electrode 114 is formed of gold, and the terminal electrode 114 is electrically connected to the FPC 110 via wire bonding. When the FPC 110 is adhered/bonded to the substrate 120, the terminal electrode 114 is pressed. At this time, the adhesive 130 rises to the surface of the FPC 110. Even though the risen adhesive 130 adheres to the terminal electrode 114 and the pressure member, because the adhesive 130 that hardly adheres to the gold on the surface of the terminal electrode 114 is used, the adhesive 130 will not remain on the terminal electrode 114. As a result, the bonding between the wire 140 and the terminal electrode 114 is not inhibited.

The thermocurable adhesive 130 or instant adhesive 130 does not generally adhere to gold, thereby preventing wire bonding failure due to rising of the adhesive in most cases.

In addition, the rear side electrode 115 is formed on the FPC 100 without intervention of the adhesive layer. With this structure, compared to a case in which a backing plate (or a reinforcing plate) is adhered with an adhesive to a reverse surface of the terminal electrode 114 of the FPC 110, there is no adhesive for adhering the backing plate, so that absorption of the vibration by the ultrasonic wave in the adhesive for adhering the backing plate is eliminated, and the bonding quality in the wire bonding can be improved.

When the rear side electrode 115 is formed on the FPC 110 without intervention of the adhesive layer, for example, a metallic film of copper or nickel is formed on the substrate 111 by soldering.

Next, a second embodiment according to the present invention will be described with reference to FIGS. 2 through 7.

Figure 2:
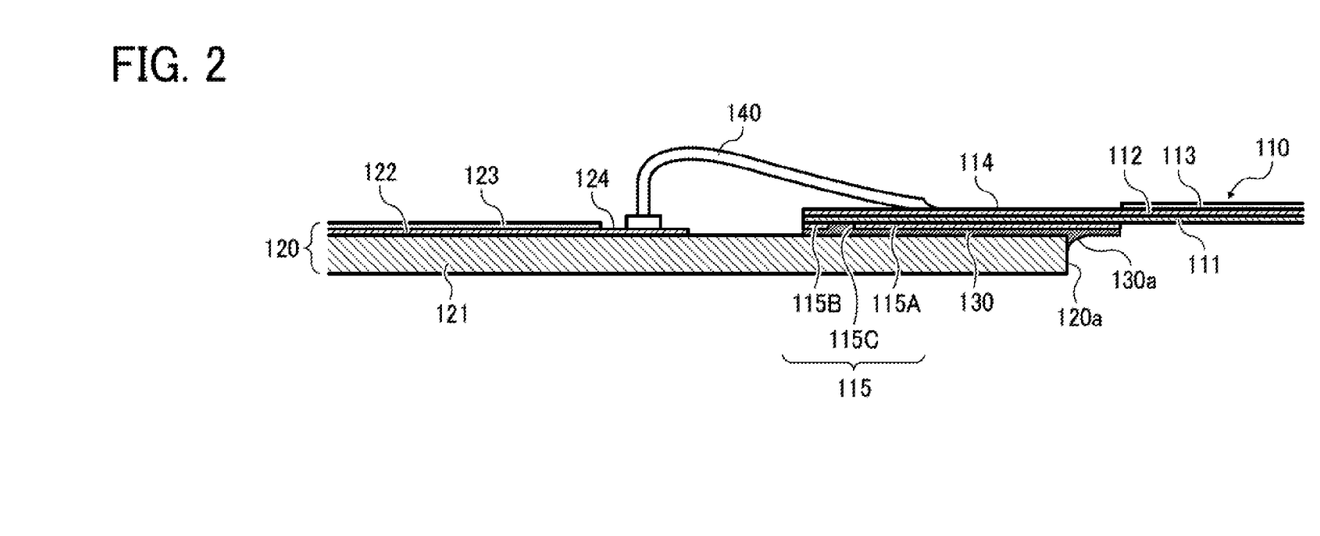
FIG. 2 is a cross-sectional view of a retaining structure of a wiring member according to a second embodiment of the present invention.
Figure 3:
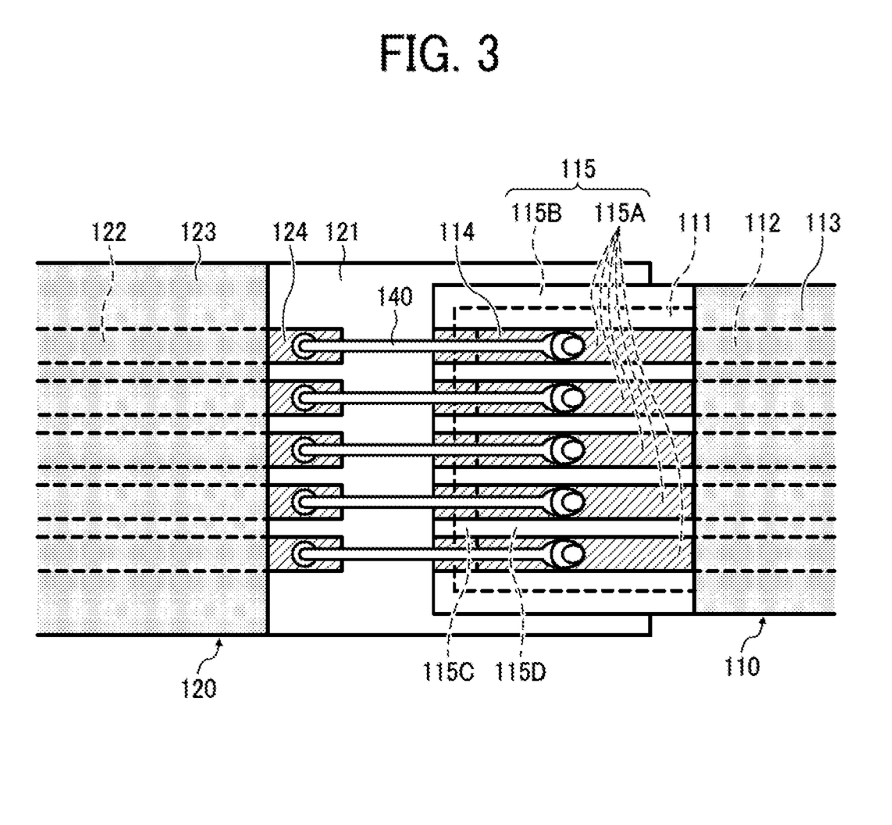
FIG. 3 is a plan view illustrating the retaining structure of the wiring member.
Figure 4:
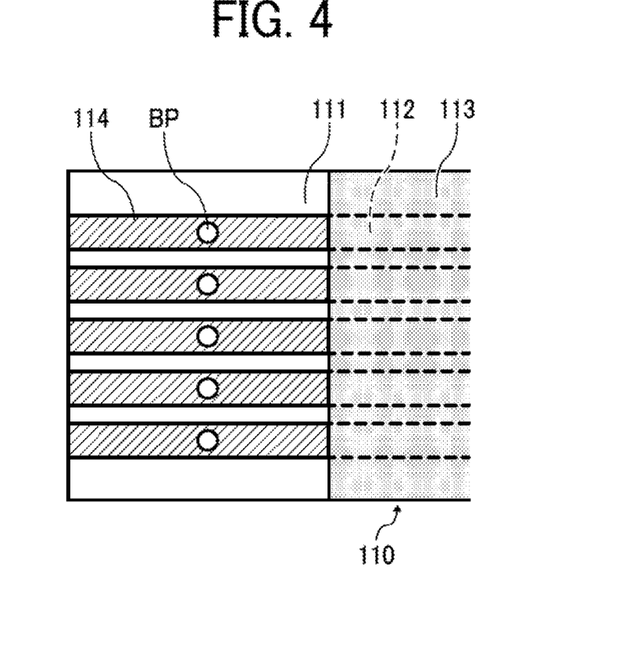
FIG. 4 is a plan view of a front side of the wiring member.
Figure 7:
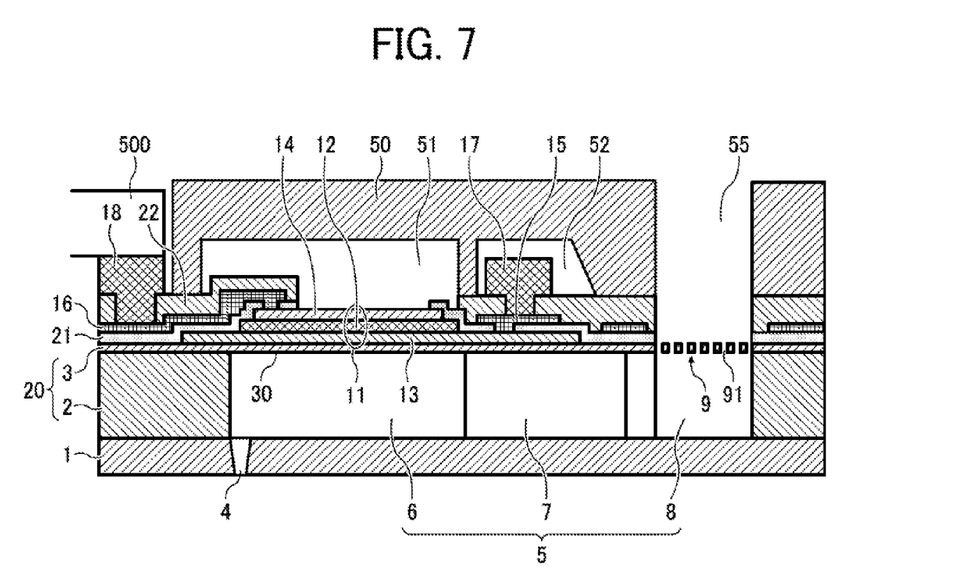
FIG. 7 is a cross-sectional view of an individual liquid chamber along a direction perpendicular to a nozzle alignment direction.

FIG. 2 is a cross-sectional view of a retaining structure of a wiring member according to the second embodiment of the present invention; FIG. 3 is a plan view of the same; FIG. 4 is a plan view of a front side of the wiring member; and FIG. 7 is a plan view of a rear side of the wiring member. "BP" shows a wire bonding position. "BP" in FIG. 5 also means the same.

In the present embodiment, the FPC 110 is bonded and is secured to an end of the substrate 120 with the adhesive 130. In this case, the adhesive 130 flows and expands to an end surface 120a of the substrate 120 from the rear side electrode 115 of the FPC 110, so that a fillet shape 130a due to the adhesive 130 is formed.

Thus, when the fillet shape 130a of the adhesive 130 is formed between the FPC 110 and the end surface 120a, adhesion strength can be increased. In particular, the adhesion becomes stronger relative to an external force to tear off the FPC 110, so that the reliability of the FPC 110 concerning the adhesion state can be improved.

Alternatively, an opening is formed on the substrate 120 with the FPC 110 disposed on the opening, and the adhesive 130 flows and expands to a side surface of the opening of the rear side electrode 115 and the substrate 120, so that the adhesive 130 may be formed to have a fillet shape.

Figure 5:
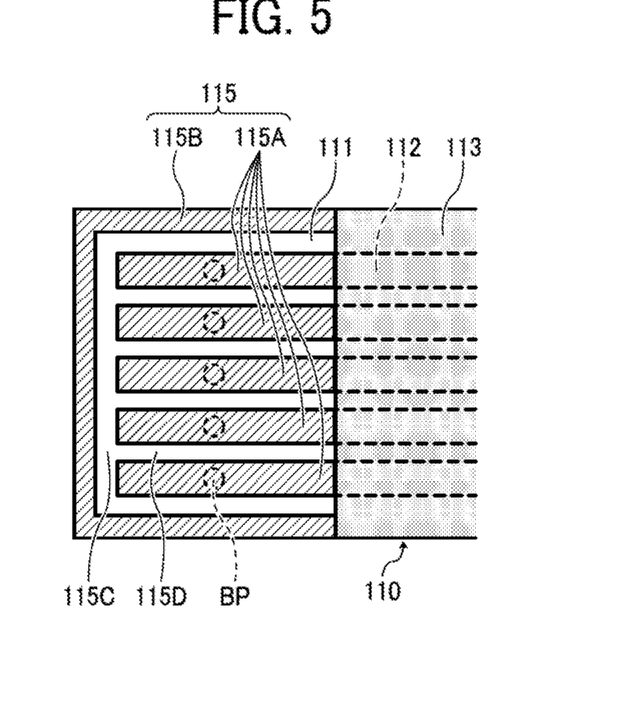
FIG. 5 is a plan view of a rear side of the wiring member.

Next, a planar shape of the rear side electrode 115 of the FPC 110 will be described.

The rear side electrode 115 of the FPC 110 includes a patterned rear side electrode 115A similarly to the terminal electrode 114 of the wiring electrode 112, and a rear side electrode 115B formed along an outer edge of the FPC 110. An area 115C where no rear side electrode is disposed between the rear side electrode 115A and the rear side electrode 115B. Because the rear side electrode 115A is patterned, an area 115D exists between adjacent rear side electrodes 115A.

The area 115C between the rear side electrode 115A and the rear side electrode 115B is disposed at an area other than the position to which the wire 140 is connected to the terminal electrode 114 via wire bonding. Specifically, part of the rear side electrode 115 corresponding to an area other than the connection area with other terminals of the terminal electrode 114 serving as the wiring electrode for the FPC 110 is removed.

Thus, provision of the areas 115C and 115D by removing part of the rear side electrode 115 allows a lot of adhesive 130 to remain in the removing part or the end surface 120a of the substrate even when a greater amount of adhesive 130 is coated, thereby strengthening adhesion compared to a case in which the adhesive 130 is thin.

Further, because the portion immediately below the position where the wire 140 is connected by wire bonding is formed as a portion where the adhesive 130 is thinly coated, the connection quality of wire bonding is not degraded. Namely, because the layer of the adhesive 130 is thin, the vibration due to the ultrasonic wave is not absorbed in the adhesive layer and the wire bonding can be done with a high bonding quality.

In addition, because there is no need of providing a convex portion on the substrate 120 to which the FPC 110 is connected, the size of the substrate 120 can be smaller. In addition, such an adhesive 130 that cannot be coated thinly, that is, a highly viscous adhesive 130 can be used.

In addition, because the rear side electrode 115B is formed on the outer edge of the FPC 110, the adhesive 130 is coated on an inner side than the outer edge of the FPC 110, thereby preventing the adhesive 130 from rising along the end of the FPC 110 and from adhering to the terminal electrode 114. As a result, deterioration of the connection quality of wire bonding due to the adhesion of the adhesive 130 to the terminal electrode 114 can be prevented.

When the adhesive 130 can be coated thinly so as not to cause the adhesive 130 to adhere the terminal electrode 114, the area 115D where no electrode is disposed, between the patterned rear side electrodes 115A, can be eliminated, the rear side electrodes 115A can be formed as a single integrated unit, and the rear side electrode 115B disposed on the outer edge can be eliminated.

Figure 8:
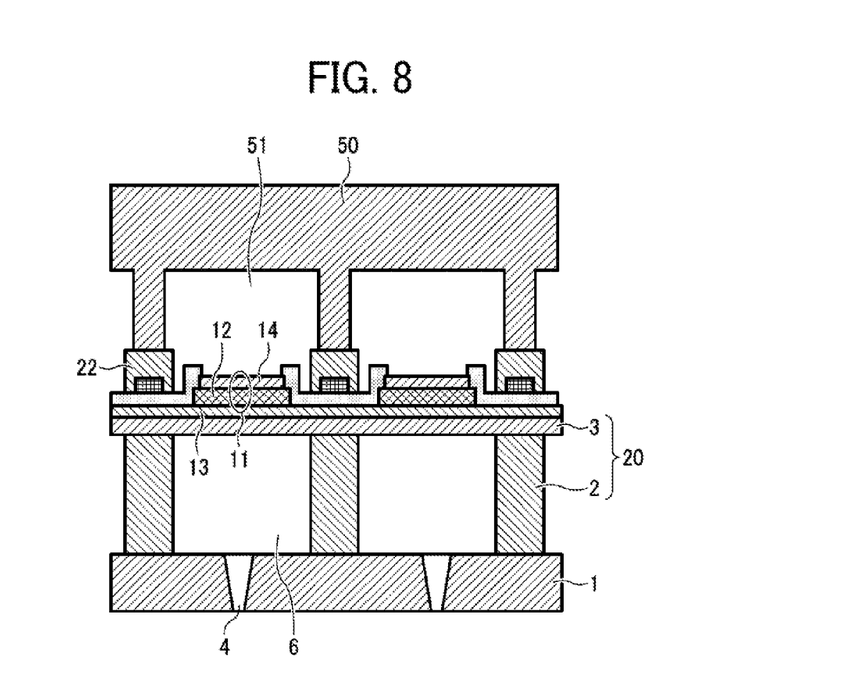
FIG. 8 is a cross-sectional view of the individual liquid chamber along the nozzle alignment direction.

Next, a third embodiment according to the present invention will be described with reference to FIGS. 6 through 8.

Figure 6:
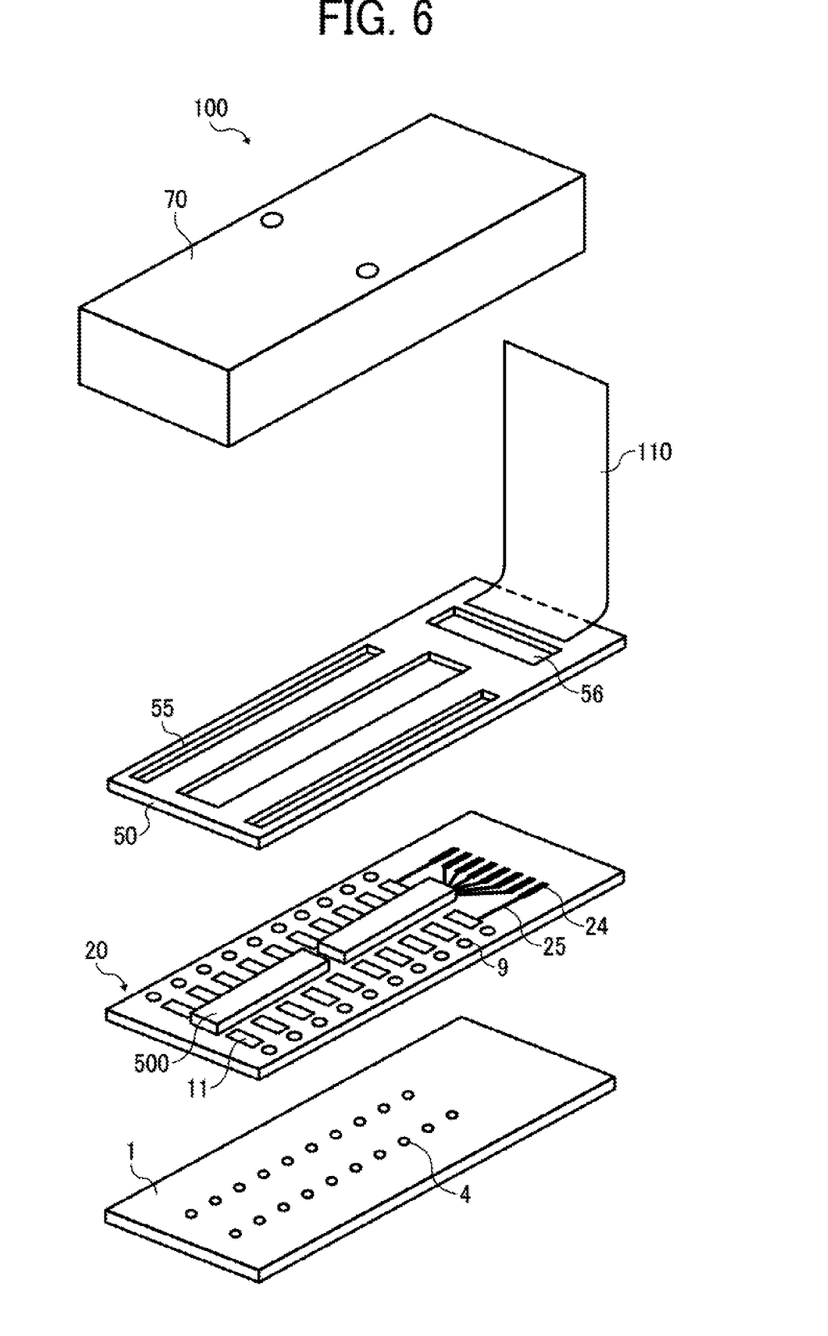
FIG. 6 is an exploded cross-sectional view of a liquid discharge head according to a third embodiment of the present invention.

FIG. 6 is an exploded cross-sectional view of a liquid discharge head according to a third embodiment of the present invention; FIG. 7 is a cross-sectional view of an individual liquid chamber along a direction perpendicular to a nozzle alignment direction; and FIG. 8 is a cross-sectional view of the individual liquid chamber along the nozzle alignment direction.

The liquid discharge head 100 includes a nozzle plate 1, a channel plate 2, a diaphragm 3, a piezoelectric element 11 as a pressure generating means, a retaining substrate 50, and a frame 70 serving also as a common liquid chamber.

In the present embodiment, the channel plate 2, the diaphragm 3, and the piezoelectric element 11 form an actuator substrate 20. However, the thus-formed actuator substrate 20 as an independent member does not mean further addition of the nozzle plate 1, the retaining substrate 50, the frame 70, and the like.

A plurality of nozzles 4 that discharges liquid droplets is disposed on the nozzle plate 1. Herein, two nozzle arrays each including a plurality of nozzles 4 are disposed.

The channel plate 2 together with the nozzle plate 1 and the diaphragm 3 form an individual liquid chamber 6 that each nozzle 4 communicates with, a fluid resistor 7 that communicates with the individual liquid chamber 6, and a liquid inlet 8 that the fluid resistor 7 communicates with. The liquid chamber 6 communicating with the nozzle 4 to discharge liquid droplets, the fluid resistor 7, and the liquid inlet 8 altogether form an individual channel 5.

The liquid inlet 8 of the individual channel 5 communicates with a common liquid chamber 10 formed by the frame 70, via a filter 9 formed on the diaphragm 3, from an opening 10A of the retaining substrate 50. The filter 9 includes one or more filter openings 91. As illustrated in FIG. 7, the filter 9 is open.

The diaphragm 3 forms a deformable vibrating area 30 as part of the wall of the individual liquid chamber 6. The piezoelectric element 11 serving as a pressure generating means is disposed integrally with the vibrating area 30 on a surface opposite the individual liquid chamber 6 of the vibrating area 30 of the diaphragm 3, so that the vibrating area 30 and the piezoelectric element 11 form a piezoelectric actuator.

The piezoelectric element 11 is constructed of, from a side of the vibrating area 30, a lower electrode 13, a piezoelectric layer 12, and an upper electrode 14 sequentially laminated in this order. An interlayer insulation film 21 is formed on the piezoelectric element 11.

The lower electrode 13 of the piezoelectric element 11 is drawn to a joint pad 17 via a common wiring 15. The upper electrode 14 is connected to a joint pad 18 via an individual wiring 16, and is connected to a driver IC 500.

The driver IC 500 is so mounted on the actuator substrate 20 as to cover an area between rows of piezoelectric elements 11 via any method, such as flip chip bonding or wire bonding.

Then, the retaining substrate 50 that forms a concave vibration chamber 51 accommodating the piezoelectric element 11 via a passivation layer 22 and provides a wiring space 52 is disposed on the actuator substrate 20.

The retaining substrate 50 also forms part of the common liquid chamber or the orifice manifold 55. The retaining substrate 50 is bonded to a side of the diaphragm 3 of the actuator substrate 20 with an adhesive.

The retaining substrate 50 is configured such that the FPC 110 serving as the wiring member is bonded and fixedly secured, which will be described later.

In the thus-configured liquid discharge head, electric voltage is applied from the driver IC 500 to a portion between the upper electrode 14 and the lower electrode 13 of the piezoelectric element 11, so that the piezoelectric layer 12 expands in a direction where the electrodes are layered, that is, in a direction of the electric field, and shrinks in a direction parallel to the vibrating area 30.

At this time, because the lower electrode 13 is retained by the vibrating area 30, tensile force is generated to the lower electrode 13 of the vibrating area 30. As a result, the vibrating area 30 is bent toward the individual liquid chamber 6 and the liquid inside the individual liquid chamber 6 is pressed, so that the liquid droplets are discharged from the nozzle 4.

Figure 9:
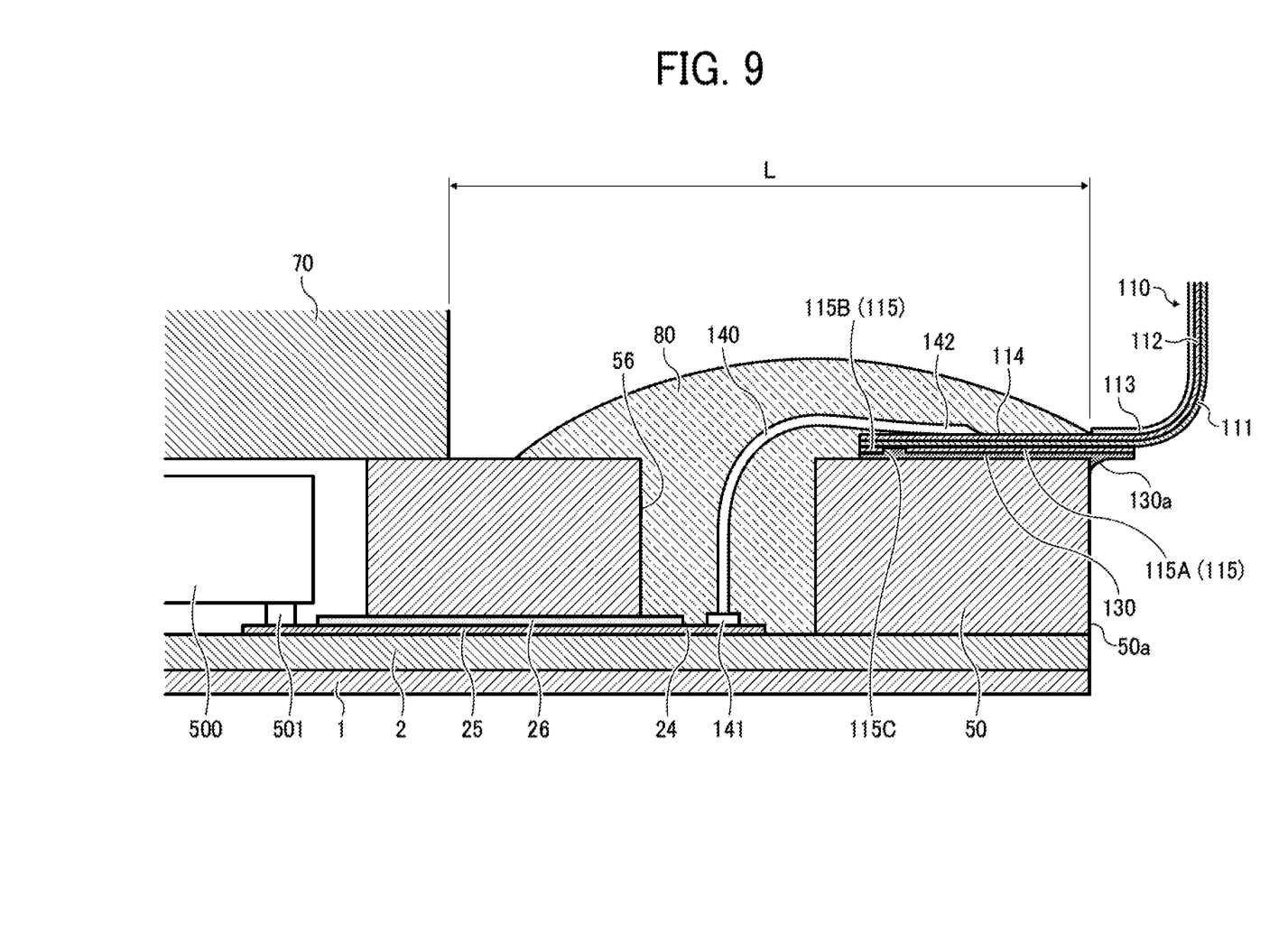
FIG. 9 is a cross-sectional view of the retaining structure of the wiring member according to the third embodiment of the present invention.

A retaining structure of the wiring member in the present liquid discharge head will be described referring to FIG. 9, which is a cross-sectional view of the retaining structure of the wiring member.

An input/output terminal, power terminal, drive power input terminal, and the like of the driver IC 500 mounted on the actuator substrate 20 are connected to a wire 25 on the actuator substrate 20 via a bump electrode 501. An insulation protective film 26 is formed on a surface of the wire 25. A terminal portion of the wire 25 is not coated by the protective film 26 and a terminal electrode 24 is disposed.

The wire 25 is formed of aluminum via semiconductor process such as sputtering, etching, and the like. The protective film 26 is formed of SiN that is an insulating film commonly used in semiconductor process.

On the other hand, the FPC 110, the wiring member, is formed by a similar manner performed in the second embodiment, includes a substrate 111, a wiring electrode 112, a coating 113, and a terminal electrode 114 formed at one end of the wiring electrode 112. In addition, the rear side electrode 115 is formed on a rear side of the substrate 111.

The rear side electrode 115 includes a patterned dummy rear side electrode 115A and a rear side electrode 115B disposed along an outer edge of the FPC 110, similarly to the case of the second embodiment.

Then, the FPC 110 is secured on the retaining substrate 50 of the actuator substrate 20 with the adhesive 130, such that the terminal electrode 114 is disposed on its front side.

Accordingly, because the FPC 110 is disposed on the retaining substrate 50 that is disposed at a higher position in the gravitational direction than the surface of the actuator substrate 20, the terminal electrode 114 of the FPC 110 is disposed at a position higher than that of the terminal electrode 24 of the actuator substrate 20.

With this structure, the actuator substrate 20 is retained and supported by the retaining substrate 50 to its end thereof. In addition, the adhesive 130 for bonding the FPC 110 is prevented from expanding to the terminal electrode 24 of the actuator substrate 20. In addition, a tool used for adhering the FPC 110 exceeding the edge of the actuator substrate 20 can be used, thereby making an assembly work at ease.

Similarly to the case of the second embodiment, the adhesive 130 flows and expands to an end surface 50a of the actuator substrate 50 from the rear side electrode 115 of the FPC 110, so that a fillet shape 130a of the adhesive 130 is formed.

With this structure, the adhesion strength between the FPC 110 and the retaining substrate 50 is increased and is stronger relative to an external force to tear off the FPC 110, so that the reliability in the adhesion of the FPC 110 can be improved.

In addition, the adhesive 130 is deliberately formed to be thin at a portion immediately below the connecting portion with the wire 140 in a direction along the wiring electrode 112, and thick in a portion between the tip end of the rear side electrode 115A and the rear side electrode 115B and at the fillet shape portion.

With this structure, compared to a case in which the entire thickness of the adhesive 130 is thin, the adhesion strength can be increased. Further, because the portion immediately below the position where the wire 140 is connected by wire bonding is formed as a portion where the adhesive 130 can be thinly coated, the connection quality of the wire bonding can be improved.

Herein, the adhesive 130 is an agent that can adhere the rear side electrode 115 of the FPC 110 firmly with the retaining substrate 50.

An adhesive that can be cured at a low temperature below 100 degrees C. in a short time of period is preferably used for the adhesive 130. With this structure, the rear side electrode 115 of the FPC 110 and the retaining substrate 50 can be securely joined together without causing the adhesive to be softened at a wire bonding temperature, without abrading the piezoelectric element 11, and without degrading a water repellent film even when the water repellent film is coated on a bottom surface of the nozzle plate 1.

In addition, considering the adhesive property, heat resistance, humidity resistance, workability, and durability, preferable for the adhesive 130 is a thermocurable adhesive, and preferred is an epoxy adhesive with a bisphenol A-type epoxy resin, bisphenol F-type epoxy resin, multi-functional epoxy resin, and the like, set as a main agent. In addition, an instant adhesive such as cyanoacrylate can also be used.

The wire 25 of the actuator substrate 20 and the wiring electrode 112 of the FPC 110 are electrically connected via a wire 140.

The wire 140 employs gold as a material. Via wire bonding using ultrasonic wave, the wire 140 connects the terminal electrode 24 to the terminal electrode 114.

Thereafter, a sealant 80 is filled in inside an opening 56 of the retaining substrate 50, thereby sealing the wire 140, and the terminal electrodes 24 and 114. As the sealant 80, epoxy resin or UV curable resin that can be hardened at a temperature lower than 100 degrees C. can be used.

Herein, the wire 140 and the terminal electrode 24 are connected by a ball bond 141, and the wire 140 and the terminal electrode 114 are connected by a stitch bond 142. As a result, the height of the wire 140 can be lowered compared to a case in which the terminal electrode 114 is connected by the ball bond and the terminal electrode 24 is connected by the stitch bond.

Because the height of the wire 140 can be lowered, the height or the leaking and expansion width of the sealant 80 can be lessened, a distance L from a right edge of the retaining substrate 50 to a right edge of the frame 70 being a concavity of the frame 70 can be shortened.

Specifically, the connector of the wire 140 can be made small, and the head can be smaller. By contrast, if the wire 140 is high, the height or the leaking and expansion width of the sealant 80 becomes large, the connector of the wire 140 need be wider for preventing interference with the frame 70.

In addition, gold is coated on the surface layer of the terminal electrode 114 and the wire 140 is made of gold, so that the ball bond 141 with reliable adhesion may be formed by dissimilar metal welding of aluminum and gold and the stitch bond 142 exhibiting weaker reliable adhesion may be formed by welding of gold and gold. With this structure, compared to a case in which welding that needs oxide film removal due to the dissimilar metal welding such as aluminum and gold is performed by the stitch bond, bonding reliability is improved. Accordingly, even though the polyimide resin, which is not as rigid as a substrate 111 of the FPC 110, is used, bonding is enabled by heating at a temperature below 100 degrees C.

If a backing plate is adhered via wire bonding to a rear surface of the electrode to be electrically connected, the adhesive for adhering the backing plate is required. However, because, in the present invention, a backing plate is not employed, the adhesive for adhering the backing plate is not required, so that the absorption of the vibration due to the ultrasonic wave in the adhesive for adhering the backing plate is eliminated compared to the above case. With this structure, the bonding quality of the wire bonding can be improved. In addition, the length of the gold wire can be shortened by a thickness of the backing plate, thereby decreasing the cost of the wire.

Thus, in the present embodiment, the bonding quality of the wire bonding and the bonding strength of the FPC can be improved. With such a structure, without deteriorating the function of the piezoelectric element and the water repellent film, each as a functional member for the head, the head can be made compact and manufactured at a low cost.

In the aforementioned embodiments, a retaining structure to adhere/bond the retaining substrate 50 joined to the actuator substrate 20 with the FPC 110, has been described. Alternatively, as described in the first embodiment, the FPC 110 can be directly adhered to the actuator substrate 20.

Next, a liquid discharge apparatus according to an embodiment of the present invention will be described with reference to FIGS. 10 and 11.

Figure 10:
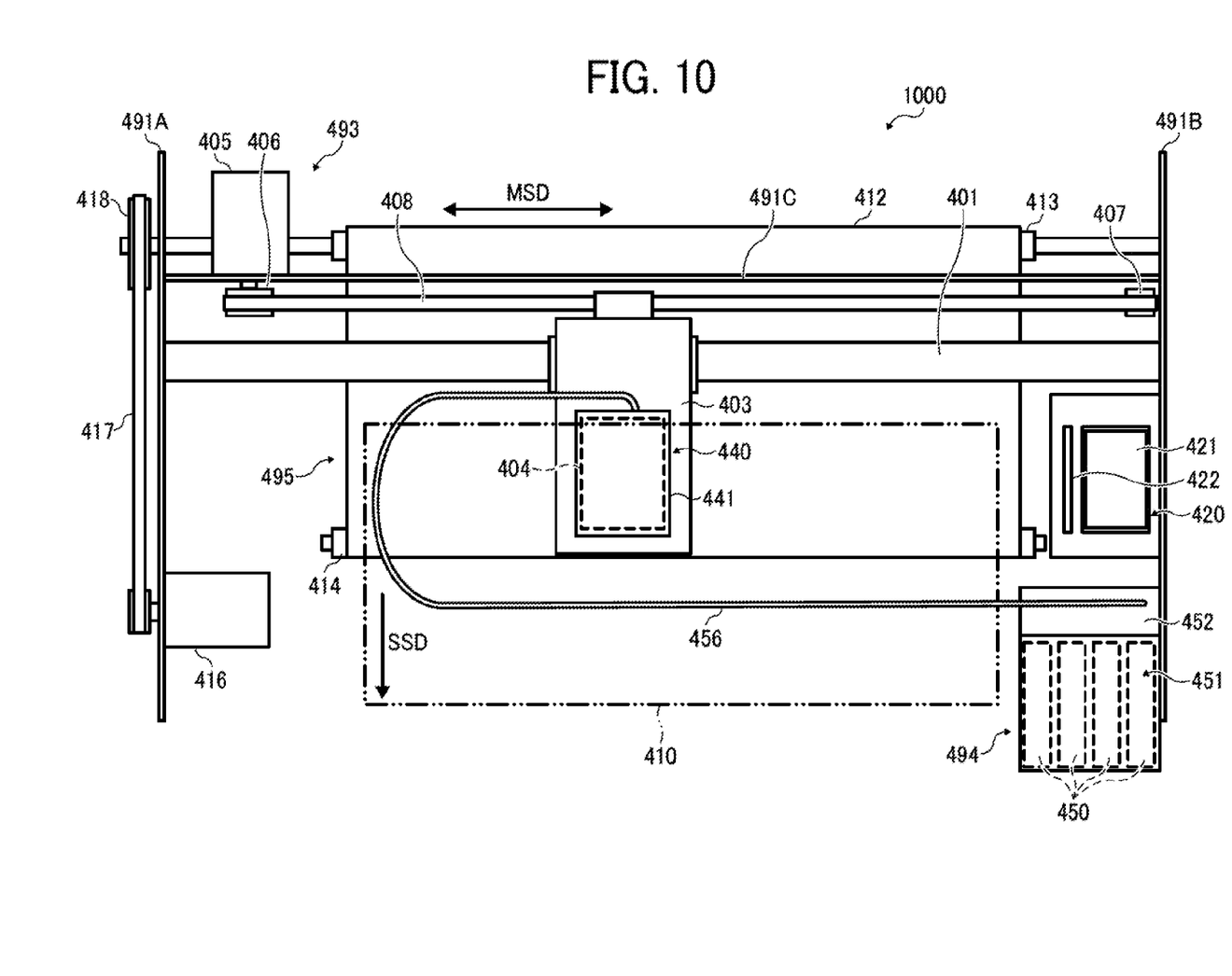
FIG. 10 is an exemplary liquid discharge apparatus illustrating a principle part thereof according to an embodiment of the present invention.
Figure 11:
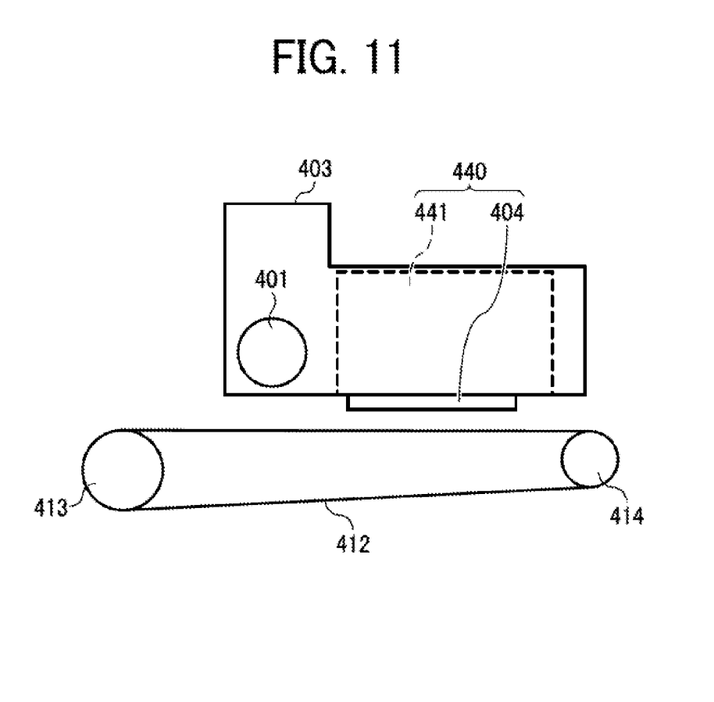
FIG. 11 illustrates a side view of the liquid discharge apparatus of FIG. 10.

FIG. 10 is an explanatory plan view illustrating a principle part of the liquid discharge apparatus according to the present embodiment, and FIG. 11 is an explanatory side view of the same.

The liquid discharge apparatus 1000 illustrated in FIG. 10 is a serial-type apparatus so that the carriage 403 reciprocally moves in a main scanning direction (indicated by arrow MSD in FIG. 10) by a main scan moving unit 493. The main scan moving unit 493 includes a guide 401, a main scan motor 405, a timing belt 408, and the like. The guide 401 is held by right and left side plates 491A, 491B and movably supports the carriage 403. The main scan motor 405 moves the carriage 403 reciprocally in the main scanning direction via a timing belt 408 stretched between a driving pulley 406 and a driven pulley 407.

A liquid discharge head 404 and a head tank 441 integrally form a liquid discharge device 440 that is mounted on the carriage 403. The liquid discharge head 404 of the liquid discharge device 440 discharges ink droplets of each color of yellow (Y), cyan (C), magenta (M), and black (K). The liquid discharge head 404 includes nozzle arrays formed of a plurality of nozzles arranged in a sub-scanning direction (indicated by arrow SSD in FIG. 10) perpendicular to the main scanning direction, with the discharging head oriented downward.

The liquid stored outside the liquid discharge head 404 is supplied to the liquid discharge head 404 via a supply unit 494 that supplies the liquid from a liquid cartridge 450 to the head tank 441.

The supply unit 494 includes a cartridge holder 451 to mount a liquid cartridge 450 thereon, a tube 456, and a liquid feed unit 452 including a feed pump. The liquid cartridge 450 is detachably attached to the cartridge holder 451. The liquid is supplied to the head tank 441 by the liquid feed unit 452 via the tube 456 from the liquid cartridge 450.

The present apparatus includes a conveying unit 495 to convey a sheet 410. The conveying unit 495 includes a conveyance belt 412, and a sub-scan motor 416 to drive the conveyance belt 412.

The conveyance belt 412 electrostatically attracts the sheet 410 and conveys it at a position facing the liquid discharge head 404. The conveyance belt 412 is an endless belt and is stretched between a conveyance roller 413 and a tension roller 414. The sheet 410 is attracted to the conveyance belt 412 due to an electrostatic force or by air aspiration.

The conveyance belt 412 is caused to rotate in the sub-scanning direction driven by a rotation of the conveyance roller 413 via a timing belt 417 and a timing pulley 418 driven by the sub-scan motor 416.

Further, a maintenance unit 420 to maintain the liquid discharge head 404 in good condition is disposed on the side of the conveyance belt 412 at one side in the main scanning direction of the carriage 403.

The maintenance unit 420 includes, for example, a cap member 421 to cap a nozzle face (i.e., a surface on which the nozzle is formed) of the liquid discharge head 404; a wiper 422 to clean the nozzle face, and the like.

The main scan moving unit 493, the supply unit 494, the maintenance unit 420, and the conveying unit 495 are disposed to a housing that includes side plates 491A, 491B, and a rear plate 491C.

In the thus-configured liquid discharge apparatus, a sheet 410 is conveyed on and attracted to the conveyance belt 412 and is conveyed in the sub-scanning direction by the cyclic rotation of the conveyance belt 412.

Then, the liquid discharge heads 404 are driven in response to image signals while the carriage 403 moving in the main scanning direction, and a liquid is discharged to the stopped sheet 410, thereby forming an image.

As a result, because the liquid discharge apparatus includes the liquid discharge head according to preferred embodiments of the present invention, a constantly high quality image is formed.

Figure 12:
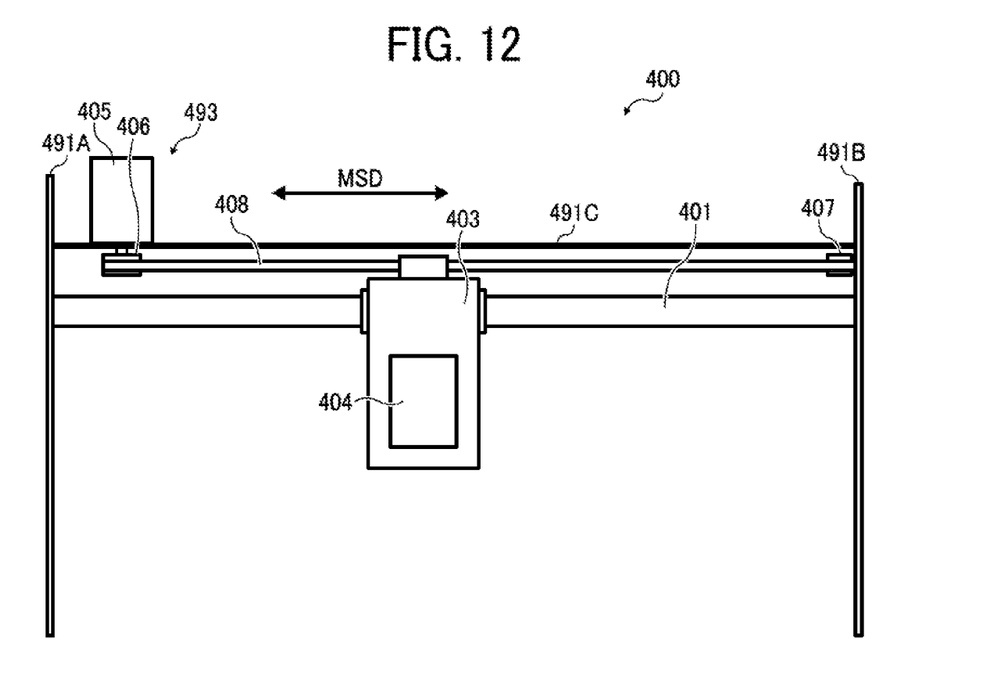
FIG. 12 is another example of a liquid discharge device illustrating a principle part thereof.

Next, a liquid discharge device according to another embodiment of the present invention will be described with reference to FIG. 12, which is a plan view illustrating a principal part of the liquid discharge device 400.

The liquid discharge device 400 includes the side plates 491A, 491B and the rear plate 491C; the main scan moving unit 493; the carriage 403; and the liquid discharge head 404.

Alternatively, the liquid discharge device 400 further including at least one of the maintenance unit 420 disposed, for example, on the side plate 491B, and the supply unit 494, may also be configured as a liquid discharge device 400.

Next, another liquid discharge device according to the present embodiment will be described with reference to FIG. 13, which is a front view illustrating a principal part of the liquid discharge device 600.

The present liquid discharge device 600 includes the liquid discharge head 404 to which a channel member 444 is attached, and the tube 456 connected to the channel member 444.

Further, the channel member 444 is disposed inside a cover 442. Instead of the channel member 444, the liquid discharge device 600 may include the head tank 441. A connector 443 disposed above the channel member 444 electrically connects the liquid discharge head 404 with a power source.

In the embodiments of the present invention, the liquid discharge apparatus includes a liquid discharge head or a liquid discharge device, and drives the liquid discharge head to discharge a liquid. As the liquid discharge apparatus, there are an apparatus capable of discharging a liquid to materials on which the liquid can be deposited as well as an apparatus to discharge the liquid toward a space or liquid.

The liquid discharge apparatus may include devices to feed, convey, and discharge the material on which the liquid can be deposited. The liquid discharge apparatus may further include a pretreatment apparatus to coat a treatment liquid onto the material, and a posttreatment apparatus to coat the treatment liquid onto the material, onto which the liquid has been discharged.

Exemplary liquid discharge apparatuses may include, for example, an image forming apparatus to form an image on the sheet by discharging ink, and a three-dimensional apparatus to discharge a molding liquid to a powder layer in which powder material is formed in layers, to form a three-dimensional article.

In addition, the liquid discharge apparatus is not limited to such an apparatus to form and visualize images with letters or figures having meaning. Alternatively, the liquid discharge apparatus forms images without meaning such as patterns and three-dimensional objects.

The above materials on which the liquid can be deposited may include any material on which the liquid may be deposited even temporarily. Exemplary materials on which the liquid can be deposited may include paper, thread, fiber, fabric, leather, metals, plastics, glass, wood, ceramics, and the like, on which the liquid can be deposited even temporarily.

In addition, the liquid may include ink, a treatment liquid, DNA sample, resist, pattern material, binder, mold liquid, and the like.

Further, the exemplary liquid discharge apparatuses include, otherwise limited in particular, any of a serial-type apparatus to move the liquid discharge head and a line-type apparatus not to move the liquid discharge head.

The exemplary liquid discharge apparatuses include otherwise a treatment liquid coating apparatus to discharge the treatment liquid to the sheet to coat the treatment liquid on the surface of the sheet for the purpose of reforming a sheet surface, and an injection granulation apparatus in which a composition liquid including a raw materials dispersed in the solution is injected with the nozzle to granulate fine particles of the raw material.

The liquid discharge device is an integrated unit including the liquid discharge head and functional parts, or the liquid discharge head and other structures, and denotes an assembly of parts relative to the liquid discharge. For example, the liquid discharge device may be formed of a combination of the liquid discharge head with one of the head tank, carriage, supply unit, maintenance unit, and main scan moving unit.

Herein, examples of integrated unit include a liquid discharge head plus functional parts, of which structure is combined fixedly to each other through fastening, binding, and engaging, and ones movably held by the other parts. In addition, the liquid discharge head can be detachably attached to the functional parts or structures.

For example, an example of the liquid discharge device 440 as illustrated in FIG. 11 is formed as a single integrated unit with the liquid discharge head and the head tank. Another example of the liquid discharge device is formed as a single integrated unit with the liquid discharge head and the head tank via the tube. A unit including a filter may further be added to a portion between the head tank and the liquid discharge head, thereby forming another liquid discharge device.

Further another example of the liquid discharge device is the liquid discharge head formed as a single integrated unit with the carriage.

Still another example of the liquid discharge device includes the liquid discharge head movably held by the guide member that forms part of the main scan moving unit, so that the liquid discharge head and the main scan moving unit are formed as a single integrated unit. Further, as illustrated in FIG. 12, the liquid discharge head, the carriage, and the main scan moving unit are formed as a single integrated unit, thereby forming the liquid discharge device 400.

Furthermore, a cap member that forms part of the maintenance unit is fixed to the carriage on which the liquid discharge head is mounted, so that the liquid discharge head, the carriage, and the maintenance unit are formed as a single integrated unit, thereby forming the liquid discharge device.

Figure 13:
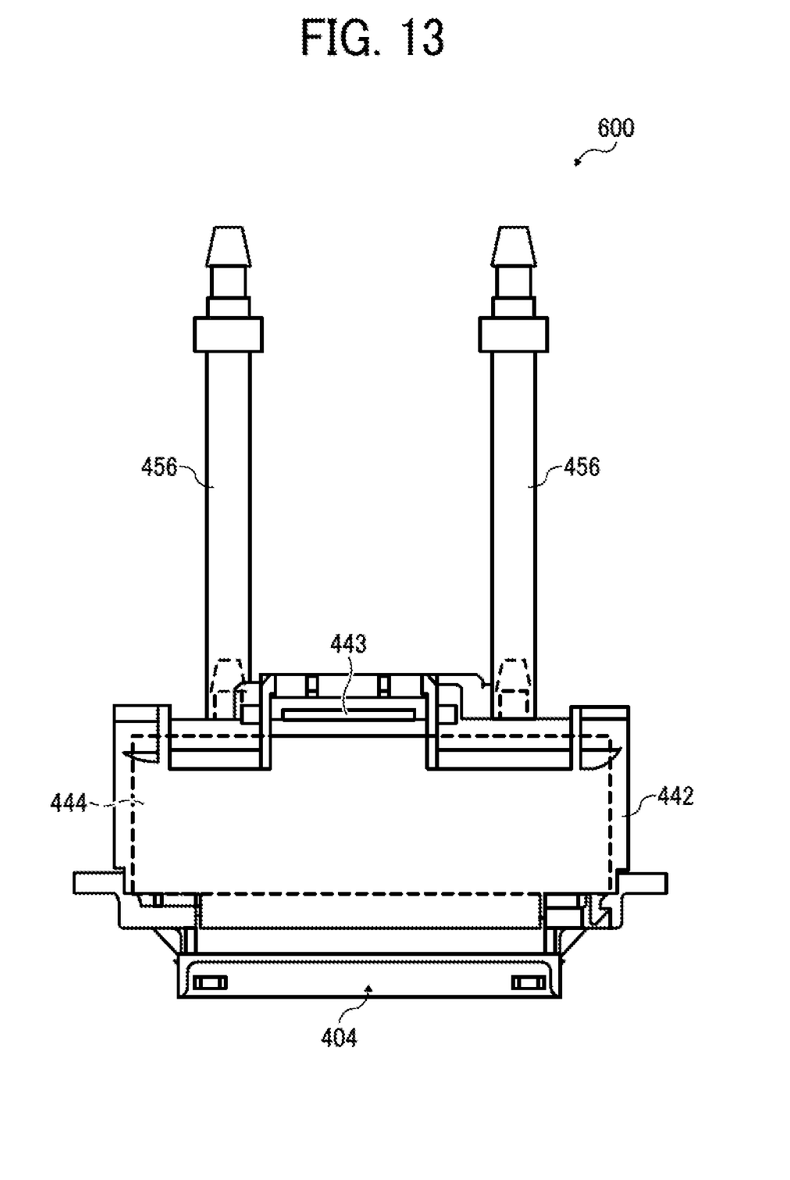
FIG. 13 is a front view of further another example of the liquid discharge device according to an embodiment of the present invention.

Further, the liquid discharge device 600 as illustrated in FIG. 13 includes the tube that is connected to the head tank or the channel member to which the liquid discharge head is attached, so that the liquid discharge head and the supply unit are formed as a single integrated unit.

The main scan moving unit shall include a guide member itself. The supply unit shall include a tube itself, and a cartridge holder itself.

The pressure generating unit of the liquid discharge head is not limited in particular. For example, other than the piezoelectric actuator (or a layered-type piezoelectric element) as described above, a thermal actuator that employs thermoelectric conversion elements such as a thermal resistor, and an electrostatic actuator formed of a vibration plate and an opposed electrode may be used.

Additional modifications and variations of the present invention are possible in light of the above teachings. It is therefore to be understood that, within the scope of the appended claims, the invention may be practiced other than as specifically described herein.

What is claimed is:

1. A retaining structure of a flexible wiring member, comprising:
   a flexible wiring member; and
   a retaining member,
   wherein the flexible wiring member includes a front side wiring electrode formed on a front side thereof and a rear side electrode formed on a rear side thereof, and
   wherein the rear side electrode of the flexible wiring member is bonded directly to the retaining member with an adhesive.

2. The retaining structure of the wiring member as claimed in claim 1, wherein the rear side electrode is patterned.

3. The retaining structure of the wiring member as claimed in claim 1, wherein the rear side electrode is a dummy electrode that is not used for transmitting signals.

4. The retaining structure of the wiring member as claimed in claim 3, wherein the rear side electrode is formed of a conductive material having adhesion to the adhesive and is disposed not to transmit signals.

5. The retaining structure of the wiring member as claimed in claim 1, wherein a part of the rear side electrode corresponding to an area other than a connection area of the front side wiring electrode is removed.

6. The retaining structure of the wiring member as claimed in claim 1, wherein the rear side electrode is formed along an outer edge of the wiring member.

7. The retaining structure of the wiring member as claimed in claim 1, wherein the front side wiring electrode is connected to other connection terminals via wire bonding.

8. The retaining structure of the wiring member as claimed in claim 1, wherein a surface metal of the front side wiring electrode and that of the rear side electrode are different.

9. The retaining structure of the wiring member as claimed in claim 1, wherein a fillet shape of an adhesive is formed between the rear side electrode of the wiring member and an end surface of the retaining member.

10. A liquid discharge head comprising:
a plurality of nozzles to discharge a liquid;
an individual liquid chamber to hold the liquid;
a pressure generator to press the liquid inside the individual liquid chamber;
an actuator substrate, including an electrode, in which a wiring and the pressure generator are disposed;
the flexible wiring member having the front side wiring electrode connected to the electrode of the actuator substrate; and
the retaining structure as claimed in claim 1, retaining the flexible wiring member to the actuator substrate or a member joined to the actuator substrate.

11. A liquid discharge device comprising the liquid discharge head as claimed in claim 10.

12. The liquid discharge device as claimed in claim 11, wherein the liquid discharge head is formed as a single integrated unit with at least one of a head tank to store a liquid to be supplied to the liquid discharge head, a carriage to mount the liquid discharge head thereon, a supply unit to supply the liquid to the liquid discharge head, a maintenance unit to maintain the liquid discharge head, and a main scan moving unit to move the liquid discharge head in a main scanning direction.

13. A liquid discharge apparatus comprising the liquid discharge device as claimed in claim 12.

14. A liquid discharge apparatus comprising the liquid discharge head as claimed in claim 10.

* * * * *